United States Patent
Goto et al.

(10) Patent No.: US 10,819,281 B2
(45) Date of Patent: Oct. 27, 2020

(54) ELECTRONIC CIRCUIT, OSCILLATOR, AND CALCULATING DEVICE

(71) Applicants: KABUSHIKI KAISHA TOSHIBA, Tokyo (JP); NEC CORPORATION, Tokyo (JP)

(72) Inventors: Hayato Goto, Kawasaki Kanagawa (JP); Tsuyoshi Yamamoto, Tokyo (JP)

(73) Assignees: Kabushiki Kaisha Toshiba, Tokyo (JP); NEC Corporation, Tokyo (JP)

( * ) Notice: Subject to any disclaimer, the term of this patent is extended or adjusted under 35 U.S.C. 154(b) by 0 days.

(21) Appl. No.: 16/519,280

(22) Filed: Jul. 23, 2019

(65) Prior Publication Data

US 2020/0091867 A1 Mar. 19, 2020

(30) Foreign Application Priority Data

Sep. 14, 2018 (JP) .................................. 2018-172912

(51) Int. Cl.
*H03B 28/00* (2006.01)
*G06N 10/00* (2019.01)
(Continued)

(52) U.S. Cl.
CPC ............. *H03B 28/00* (2013.01); *G06N 10/00* (2019.01); *H01L 27/18* (2013.01); *H01L 39/223* (2013.01)

(58) Field of Classification Search
CPC ...................................................... H03B 28/00
(Continued)

(56) References Cited

U.S. PATENT DOCUMENTS

| 9,806,711 B1 * | 10/2017 | Abdo ........................ H03F 7/04 |
| 10,586,911 B1 * | 3/2020 | Sandberg .............. H01L 39/223 |
| 2017/0104493 A1 | 4/2017 | Goto |

FOREIGN PATENT DOCUMENTS

JP 2017-73106 4/2017

OTHER PUBLICATIONS

Goto, "Bifurcation-based adiabatic quantum computation with a nonlinear oscillator network," Scientific Reports (Feb. 22, 2016), pp. 1-8.

(Continued)

*Primary Examiner* — Joseph Chang
(74) *Attorney, Agent, or Firm* — Finnegan, Henderson, Farabow, Garrett, & Dunner, L.L.P.

(57) ABSTRACT

According to one embodiment, an electronic circuit includes a first conductive component, a second conductive component, a first current path, and a second current path. The second conductive component is capacitively coupled to the first conductive component. The first current path of a superconductor includes a first portion and a second portion. The first portion is connected to the first conductive component. The second portion is connected to the second conductive component. The first current path includes N first Josephson junctions connected in series and provided between the first and second portions. The second current path of a superconductor includes a third portion and a fourth portion. The third portion is connected to the first conductive component. The fourth portion is connected to the second conductive component. The second current path includes a second Josephson junction connected in series and provided between the third and fourth portions.

12 Claims, 5 Drawing Sheets

(51) Int. Cl.
  *H01L 39/22* (2006.01)
  *H01L 27/18* (2006.01)
(58) Field of Classification Search
  USPC .......................................................... 331/46
  See application file for complete search history.

(56) References Cited

OTHER PUBLICATIONS

Goto, "Universal quantum computation with a nonlinear oscillator network," Physical Review (2016), 93:050301-1-050301-4.
Puri et al., "Quantum annealing with all-to-all connected nonlinear oscillators," Nature Communications (Jun. 8, 2017), pp. 1-9.
Nigg et al., "Robust quantum optimizer with full connectivity," Science Advances (Apr. 7, 2017), 3:1-7.
Zhao et al., "Two-photon driven Kerr resonator for quantum annealing with three-dimensional circuit QED," arXiv:171203613v2 (Dec. 12, 2017), pp. 1-13.
Lin et al., "Josephson parametric phase-locked oscillator and its application to dispersive readout of superconducting qubits," Nature Communications (Jul. 25, 2014), pp. 1-6.
Barends et al., "Coherent Josephson Qubit Suitable for Scalable Quantum Integrated Circuits," Physcial Review Letters (Aug. 23, 2013), 111:080502-1-080502-5.
Eichler et al., "Controlling the dynamic range of a Josephson parametric amplifier," EPJ Quantum Technology (2014), pp. 1-19.

\* cited by examiner

ELECTRONIC CIRCUIT, OSCILLATOR, AND CALCULATING DEVICE

CROSS-REFERENCE TO RELATED APPLICATIONS

This application is based upon and claims the benefit of priority from Japanese Patent Application No. 2018-172912, filed on Sep. 14, 2018; the entire contents of which are incorporated herein by reference.

FIELD

Embodiments described herein relate generally to an electronic circuit, an oscillator, and a calculating device.

BACKGROUND

For example, a quantum computer that utilizes a network of nonlinear oscillators has been proposed. An electronic circuit for an oscillator is desirable in which both nonlinearity and low loss are realized.

DETAILED DESCRIPTION

Figure 1A:
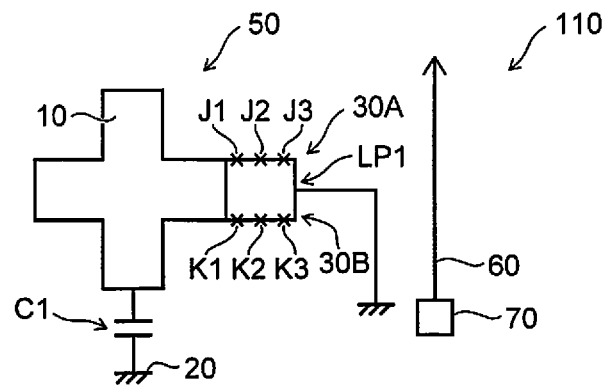
FIG. 1A to FIG. 1C are schematic views illustrating an oscillator and an electronic circuit according to a first embodiment.

According to one embodiment, an electronic circuit includes a first conductive component, a second conductive component, a first current path, and a second current path. The second conductive component is capacitively coupled to the first conductive component. The first current path of a superconductor includes a first portion and a second portion. The first portion is connected to the first conductive component. The second portion is connected to the second conductive component. The first current path includes N first Josephson junctions (N being an integer of 2 or more) connected in series and provided between the first portion and the second portion. The second current path of a superconductor includes a third portion and a fourth portion. The third portion is connected to the first conductive component. The fourth portion is connected to the second conductive component. The second current path includes a second Josephson junction connected in series and provided between the third portion and the fourth portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
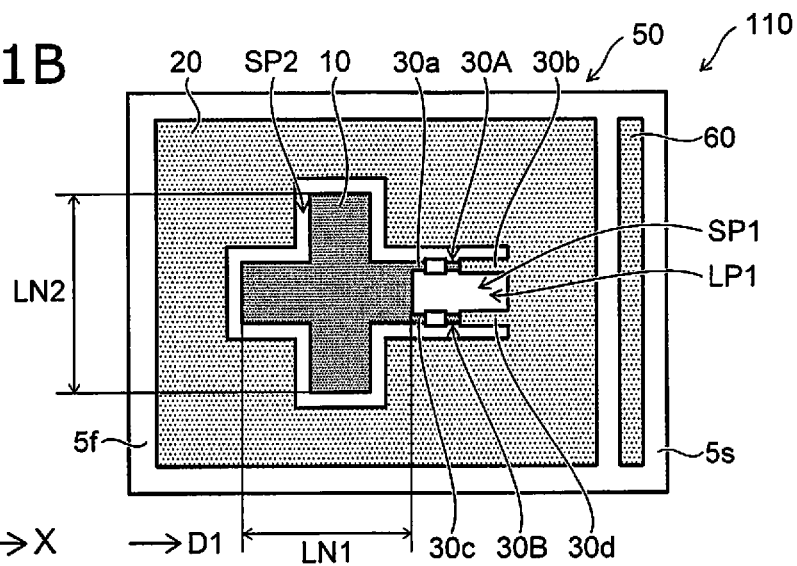
Figure 1C:
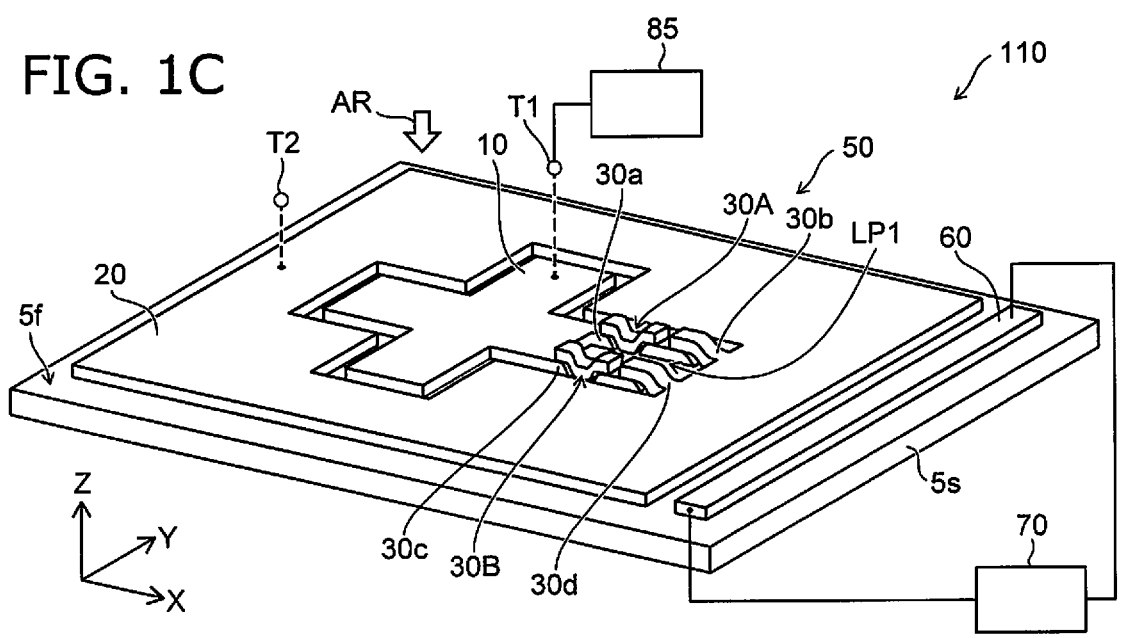

FIG. 1A to FIG. 1C are schematic views illustrating an oscillator and an electronic circuit according to a first embodiment.

FIG. 1A is a schematic view. FIG. 1B is a schematic plan view as viewed along arrow AR of FIG. 1C. FIG. 1C is a perspective view.

As shown in FIG. 1A to FIG. 1C, the oscillator 110 includes the electronic circuit 50 and a magnetic field application portion 60. The electronic circuit 50 includes a first conductive component 10, a second conductive component 20, a first current path 30A, and a second current path 30B. The first current path 30A and the second current path 30B include superconductors. The first current path 30A and the second current path 30B are made of superconductors, for example.

The first current path 30A is coupled to the first conductive component 10 and the second conductive component 20. For example, the first current path 30A includes a first portion 30a and a second portion 30b. The first portion 30a is connected to the first conductive component 10. The second portion 30b is connected to the second conductive component 20.

The first current path 30A includes N (N being an integer of 2 or more) first Josephson junctions (in the example, Josephson junctions J1 to J3, etc.). The N first Josephson junctions are provided between the first portion 30a and the second portion 30b. The N first Josephson junctions are connected in series to each other. In the example, "N" is 3. N is arbitrary in the embodiment.

The second current path 30B is coupled to the first conductive component 10 and the second conductive component 20. For example, the second current path 30B includes a third portion 30c and a fourth portion 30d. The third portion 30c is connected to the first conductive component 10. The fourth portion 30d is connected to the second conductive component 20.

The second current path 30B includes M (M being an integer of 1 or more) second Josephson junctions (in the example, Josephson junctions K1 to K3, etc.). The M second Josephson junctions are provided between the third portion 30c and the fourth portion 30d. The M second Josephson junctions are connected in series to each other. In one example, multiple second Josephson junctions are provided; and the number of the multiple second Josephson junctions is the same as "N" recited above. For example, "M" is the same as "N."

For example, the first conductive component 10 and the second conductive component 20 are capacitively coupled to each other.

For example, a substrate 5s may be provided as shown in FIG. 1B and FIG. 1C. The substrate 5s has a first surface 5f. For example, the first conductive component 10 and the second conductive component 20 are provided at the first surface 5f. The first conductive component 10 and the second conductive component 20 have, for example, film configurations.

In the example, the second conductive component 20 is provided around the first conductive component 10 along the first surface 5f. For example, the second conductive component 20 may surround the first conductive component 10 along the first surface 5f. The first conductive component 10 and the second conductive component 20 are separated from each other.

A plane along the first surface 5f is taken as an X-Y plane. A direction perpendicular to the X-Y plane is taken as a Z-axis direction.

In the example as shown in FIG. 1B, the first current path 30A and the second current path 30B extend along one direction (a first direction D1). In the example, the first direction D1 is an X-axis direction. A direction from the second current path 30B toward the first current path 30A is aligned in a Y-axis direction.

Thus, in the example, the second current path 30B is aligned with the first current path 30A. In the embodiment, the direction of the first current path 30A may be different from the direction of the second current path 30B.

One loop LP1 is formed of the first conductive component 10, the second conductive component 20, the first current path 30A, and the second current path 30B.

The magnetic field application portion 60 applies a magnetic field to one space (e.g., the loop LP1) surrounded with the first conductive component 10, the second conductive component 20, the first current path 30A, and the second current path 30B. The magnetic field passes through the space (e.g., the loop LP1). The magnetic field is a direct current magnetic field or an alternating magnetic field. The magnetic field application portion 60 may be, for example, an interconnect line (a conductive layer, etc.).

A controller 70 is provided as shown in FIG. 1A and FIG. 1C. The controller 70 supplies a current to the magnetic field application portion 60. The controller 70 modulates the current. An oscillation that corresponds to the modulation of the current is generated. The oscillation frequency of the oscillator 110 changes according to the modulation frequency of the current. For example, the oscillation frequency of the oscillator 110 is substantially 0.5 times the frequency of the modulation of the current.

For example, the first conductive component 10 is capacitively coupled to a first terminal T1. The second conductive component 20 is capacitively coupled to a second terminal T2.

In one example as shown in FIG. 1A, the second conductive component 20 is set to a ground potential. For example, the potential of the second conductive component 20 is substantially fixed. In such a case, the second terminal T2 is set to the ground potential.

For example, a surface area of the second conductive component 20 is not less than 2 times the surface area of the first conductive component 10. A large surface area of the second conductive component 20 stabilizes the potential of the second conductive component 20.

For example, a reader 85 may be connected to the first terminal T1 connected to the first conductive component 10. The potential of the first conductive component 10 is detected by the reader 85. A signal (e.g., an electrical signal) that accompanies the oscillation is detected by the reader 85.

As shown in FIG. 1B, two spaces (e.g., a space SP1 and a space SP2) are defined by the first conductive component 10, the second conductive component 20, the first current path 30A, and the second current path 30B. The space SP1 corresponds to the loop LP1. The distance between the space SP1 and the magnetic field application portion 60 is shorter than the distance between the space SP2 and the magnetic field application portion 60. The strength of the magnetic field generated by the magnetic field application portion 60 and passing through the space SP1 is stronger than the strength of the magnetic field generated by the magnetic field application portion 60 and passing through the space SP2. Therefore, in the electronic circuit 50, it can be considered that the magnetic field from the magnetic field application portion 60 is generated in substantially one space (space SP1). For example, no current path links the first conductive component 10 and the second conductive component 20 between the first current path 30A and the second current path 30B.

Thus, in the embodiment, the magnetic field from the magnetic field application portion 60 is generated in substantially one loop LP1 (the space SP1). The length in one direction (e.g., the length along the Y-axis direction) of the loop LP1 is relatively short. The length in another direction (e.g., the length along the X-axis direction) of the loop LP1 also is relatively short.

The length in the X-axis direction of the first conductive component 10 is expressed as a length LN1. The length in the Y-axis direction of the first conductive component 10 is expressed as a length LN2.

For example, the distance between the second current path 30B and the first current path 30A is shorter than the length LN2 of the first conductive component 10 in a direction (the Y-axis direction) from the second current path 30B toward the first current path 30A. For example, the lengths (e.g., the lengths along the X-axis direction) of the second current path 30B and the first current path 30A each are shorter than the length LN1 of the first conductive component 10 in the X-axis direction.

For example, the surface area of the loop LP1 (the space SP1) formed of the first conductive component 10, the second conductive component 20, the first current path 30A, and the second current path 30B is less than the surface area of the first conductive component 10.

A small (a short) first conductive component 10 is provided in the embodiment. For example, the first conductive component 10 can be considered to be a lumped constant circuit. The length LN1 and the length LN2 each are small compared to the wavelength corresponding to the oscillation frequency. By setting the Josephson junction number N to be 2 or more, even without using a giant capacitor, an oscillation at the desired oscillation frequency is possible; and a low-loss property of the lumped constant circuit can be maintained.

A quantum computer that utilizes a network of nonlinear oscillators has been proposed. Low loss and high nonlinearity of the nonlinear oscillator is necessary. For example, a Josephson parametric oscillator that uses a dc SQUID is one candidate for the nonlinear oscillator. The loss is large for currently known waveguide-type Josephson parametric oscillators.

On the other hand, for example, a superconducting quantum bit is another candidate for the nonlinear oscillator. The loss of a superconducting quantum bit is low; but the nonlinearity is too large for a parametric oscillator. If the critical current of the Josephson junction is increased to reduce the nonlinearity, a giant capacitor is necessary to obtain the target resonant frequency. The loss increases for a huge capacitor; and the low-loss property of the quantum bit is lost.

An array that includes multiple dc SQUIDs may be considered to reduce the nonlinearity while maintaining a small capacitor at the same resonant frequency. However, an array including dc SQUIDs has a complex structure. Further, because multiple dc SQUIDs are used, the magnetic field becomes nonuniform; and it is difficult to obtain the desired operation (oscillation).

Conversely, similarly to the superconducting quantum bit, the electronic circuit 50 according to the embodiment is a lumped constant circuit-type. That is, a giant capacitor is unnecessary. The capacitor can be small. Therefore, the loss of the electronic circuit 50 according to the embodiment is low. Substantially one loop LP1 is provided in the electronic circuit 50. Therefore, nonuniformity of the magnetic field does not occur. The desired operation (oscillation) is obtained using a simple structure. A Josephson parametric oscillator that has good characteristics is obtained. According to the embodiment, an electronic circuit and an oscillator can be provided in which both nonlinearity and low loss can be realized.

In the embodiment, a Josephson junction that has an extremely large critical current (e.g., 0.1 mA or more) would have a small effect; therefore, such a Josephson junction is not included in the "Josephson junction" according to the embodiment.

In one example, the critical current value of the first Josephson junction is substantially the same as the critical current value of the second Josephson junction. The critical current value of the first Josephson junction is not less than 0.7 times and not more than 1.3 times the critical current value of the second Josephson junction. One of the critical current values of the multiple first Josephson junctions is not less than 0.7 times and not more than 1.3 times each critical current value of the multiple second Josephson junctions. The average value of the critical current values of the multiple first Josephson junctions is not less than 0.7 times and not more than 1.3 times the average value of the critical current values of the multiple second Josephson junctions.

In one example, the average value of the critical current values of the multiple first Josephson junctions and the average value of the critical current values of the multiple second Josephson junctions each are not less than 0.7 times and not more than 1.3 times the other.

In one example, the capacitance between the first conductive component 10 and the second conductive component 20 is, for example, not less than 0.01 pF. The capacitance is, for example, not more than 1 pF.

An example of operations of the electronic circuit 50 and the oscillator 110 will now be described.

Figure 2:
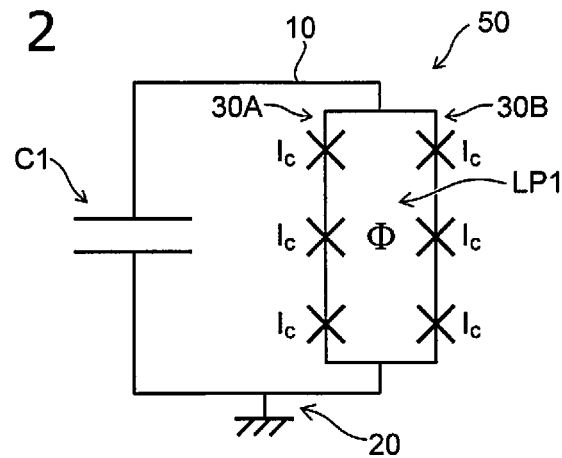
FIG. 2 is a schematic view illustrating the electronic circuit according to the first embodiment.

FIG. 2 is a schematic view illustrating the electronic circuit according to the first embodiment.

FIG. 2 is an equivalent circuit of the electronic circuit 50.

As shown in FIG. 2, the first current path 30A and the second current path 30B are connected to the first conductive component 10 and the second conductive component 20. In the example, the second conductive component 20 is set to the ground potential. A capacitor C1 is formed between the first conductive component 10 and the second conductive component 20. The capacitor C1 has a capacitance C. The capacitance C corresponds to the capacitance between the two ends of the loop LP1. Each critical current of the multiple Josephson junctions provided in the first current path 30A and the second current path 30B is expressed as a critical current A magnetic field is applied to the loop LP1 formed of the first conductive component 10, the second conductive component 20, the first current path 30A, and the second current path 30B. The magnetic flux that passes through the loop LP1 is expressed as a magnetic flux $\Phi$.

The Hamiltonian H of the electronic circuit 50 is represented by the following first formula.

$$H = \frac{C}{2}\dot{\phi}^2 - 2NI_c\phi_0\cos\frac{\pi\Phi}{2N\Phi_0}\cos\frac{\phi}{N\phi_0} \quad (1)$$

In the first formula, "$\phi$" is the magnetic flux operator. The "$\phi$" with the "dot" represents the time derivative. "$\Phi_0$" is the magnetic flux quantum. $\phi_0$ is $\Phi_0/2\pi$. "$\pi$" is pi. "N" is the number of Josephson junctions provided in one current path. "$I_c$" is the critical current of one Josephson junction. "C" is the capacitance of the capacitor C1 formed by the first conductive component 10 and the second conductive component 20.

The Hamiltonian H is quantized. Thereby, a resonant frequency $\omega_r$ is represented by the following second formula. The Kerr coefficient K is represented by the following third formula. The Kerr coefficient K represents the nonlinearity.

$$\omega_r = \frac{1}{\sqrt{L_J C}} \quad (2)$$

$$K = \frac{\omega_C}{N^2} \quad (3)$$

In the second formula recited above, "$L_J$" is the effective Josephson inductance. "$L_J$" is represented by the following fourth formula.

$$L_J = \frac{N\phi_0}{2I_c\cos(\pi\Phi/\Phi_0)} \quad (4)$$

"$\omega_c$" of the third formula recited above is represented by the following fifth formula.

$$\omega_c = \frac{2\pi}{h}\frac{e^2}{2C} \quad (5)$$

"h" of the fifth formula is Planck's constant. "e" is the elementary charge.

In a general quantum bit (a reference example), the number of Josephson junctions (N) is 1. Multiple (N) Josephson junctions are provided in the embodiment. The case where N Josephson junctions are provided will now be compared to the reference example in which one Josephson junction is provided. When N Josephson junctions are provided, the same resonant frequency as the reference example can be obtained with the same capacitance by setting the critical current $I_c$ to be N times the critical current $I_c$ of the reference example. The nonlinearity when the N Josephson junctions are provided can be reduced to $1/N^2$ times the nonlinearity of the reference example.

In the embodiment, "N" is 2 or more. Thereby, it is unnecessary to markedly increase the capacitance to obtain the target resonant frequency. For example, a moderately small nonlinearity is obtained. An oscillator that has good characteristics is obtained. The oscillator is, for example, a Josephson parametric oscillator. The oscillator is the lumped constant circuit-type.

One loop LP1 is provided in the electronic circuit 50 according to the embodiment. Nonuniformity of the magnetic field does not occur.

The Kerr coefficient K becomes too small if "N" is too large. It is unfavorable for "N" to be too large when applying the oscillator to a quantum computer. For example, it is desirable for the Kerr coefficient K to be not less than one-millionth of the oscillation frequency. This means that the operation speed that is determined by the Kerr coefficient K is fast compared to the relaxation rate when the Q factor of the resonator included in the oscillator is one million. For example, it is favorable for the Kerr coefficient K of the third formula to be greater than one-millionth of the resonant frequency $\omega_r$ of the second formula.

The calculating device (the quantum computer) is obtained by coupling multiple oscillators according to the embodiment to each other.

In the embodiment, it is favorable for the capacitance C of the capacitor C1 to be, for example, 1 pF or less. Because the capacitance is this small, the capacitor can be small; and the loss can be reduced. On the other hand, it is desirable for the capacitance C to be, for example, not less than 0.01 pF. For example, a normal operation as the oscillator is easy.

In the embodiment, the length (the length LN1 or the length LN2) of the first conductive component 10 along one direction along the first surface 5f is, for example, not more than ⅛ of the wavelength corresponding to the oscillation frequency. Practically, the length may be not more than 1/1000 of the wavelength corresponding to the oscillation frequency.

One example of the electronic circuit 50 will now be described.

In the example, the capacitance C is 0.1 pF. The case is considered where the DC component $\Phi_{DC}$ of the magnetic flux D satisfies the relationship $\Phi_{DC}/(N\Phi_0)=¼$. Here, the resonant frequency $(\omega_r/2\pi)$ is taken to be 10 GHz. The nonlinearity $(K/2\pi)$ of the quantum bit (N being 1) is 194 MHz; and the critical current $I_c$ is 0.09 μA. On the other hand, when N is 2, the nonlinearity $(K/2\pi)$ is 48 MHz; and the critical current $I_c$ is 0.18 μA. When N is 3, the nonlinearity $(K/2\pi)$ is 22 MHz; and the critical current $I_c$ is 0.27 μA. When N is 4, the nonlinearity $(K/2\pi)$ is 12 MHz; and the critical current $I_c$ is 0.36 μA. Thus, according to the embodiment, the nonlinearity can be reduced without changing the resonant frequency and the capacitance.

An example of the current path recited above will now be described.

Figure 3A:
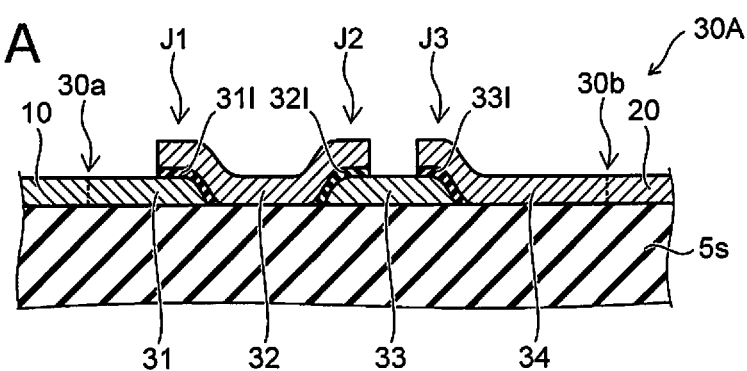
FIG. 3A and FIG. 3B are schematic cross-sectional views illustrating portions of the electronic circuit according to the first embodiment.
Figure 3B:
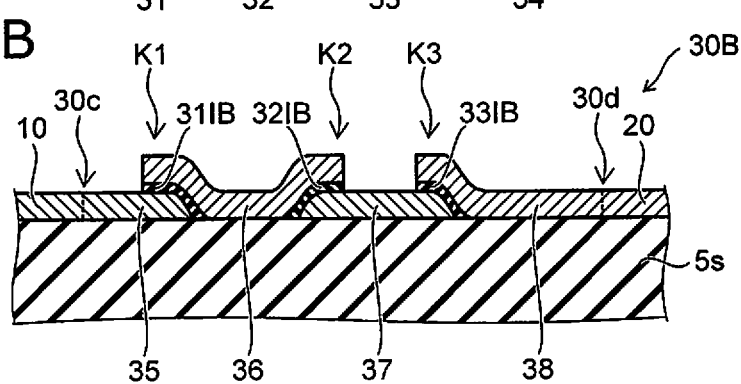

FIG. 3A and FIG. 3B are schematic cross-sectional views illustrating portions of the electronic circuit according to the first embodiment.

These drawings are cross-sectional views along the X-Z plane. In the example as shown in FIG. 3A, the first portion 30a of the first current path 30A is continuous with the first conductive component 10. The second portion 30b of the first current path 30A is continuous with the second conductive component 20. The first current path 30A includes a first layer 31, a second layer 32, a third layer 33, and a fourth layer 34. The first layer 31 corresponds to the first portion 30a. The fourth layer 34 corresponds to the second portion 30b. An insulating film 311 is provided between the first layer 31 and the second layer 32. An insulating film 321 is provided between the second layer 32 and the third layer 33. An insulating film 331 is provided between the third layer 33 and the fourth layer 34. The directions in which these conductive components extend may not be parallel to each other. These directions may cross each other.

The portion that includes the insulating film 311 is the Josephson junction J1. The portion that includes the insulating film 321 is the Josephson junction J2. The portion that includes the insulating film 331 is the Josephson junction J3.

In the example as shown in FIG. 3B, the third portion 30c of the second current path 30B is continuous with the first conductive component 10. The fourth portion 30d of the second current path 30B is continuous with the second conductive component 20. The second current path 30B includes a fifth layer 35, a sixth layer 36, a seventh layer 37, and an eighth layer 38. The fifth layer 35 corresponds to the third portion 30c. The eighth layer 38 corresponds to the fourth portion 30d. An insulating film 311B is provided between the fifth layer 35 and the sixth layer 36. An insulating film 321B is provided between the sixth layer 36 and the seventh layer 37. An insulating film 331B is provided between the seventh layer 37 and the eighth layer 38.

The portion that includes the insulating film 311B is the Josephson junction K1. The portion that includes the insulating film 321B is the Josephson junction K2. The portion that includes the insulating film 331B is the Josephson junction K3.

Another example of the oscillator and the electronic circuit according to the embodiment will now be described. The portions that are different from those of the electronic circuit 50 and the oscillator 110 will be described.

Figure 4A:
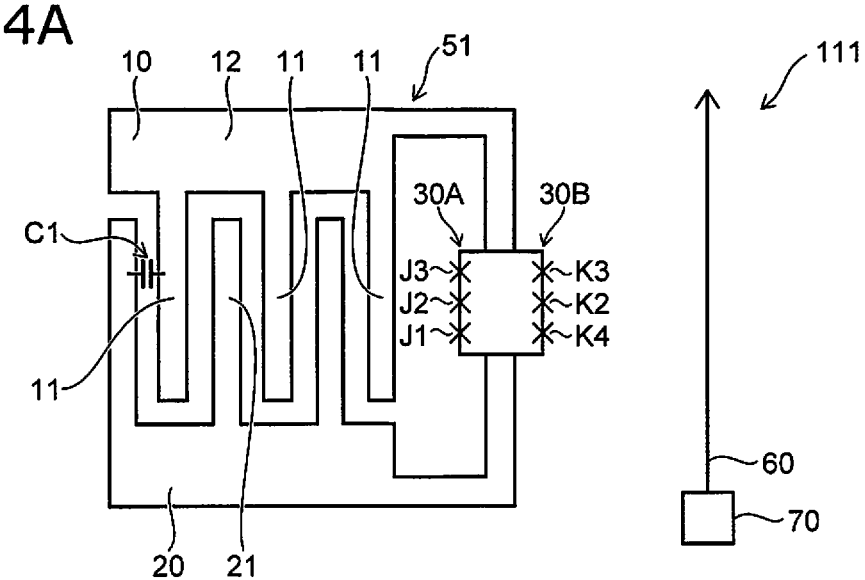
FIG. 4A and FIG. 4B are schematic views illustrating the oscillator and the electronic circuit according to the first embodiment.
Figure 4B:
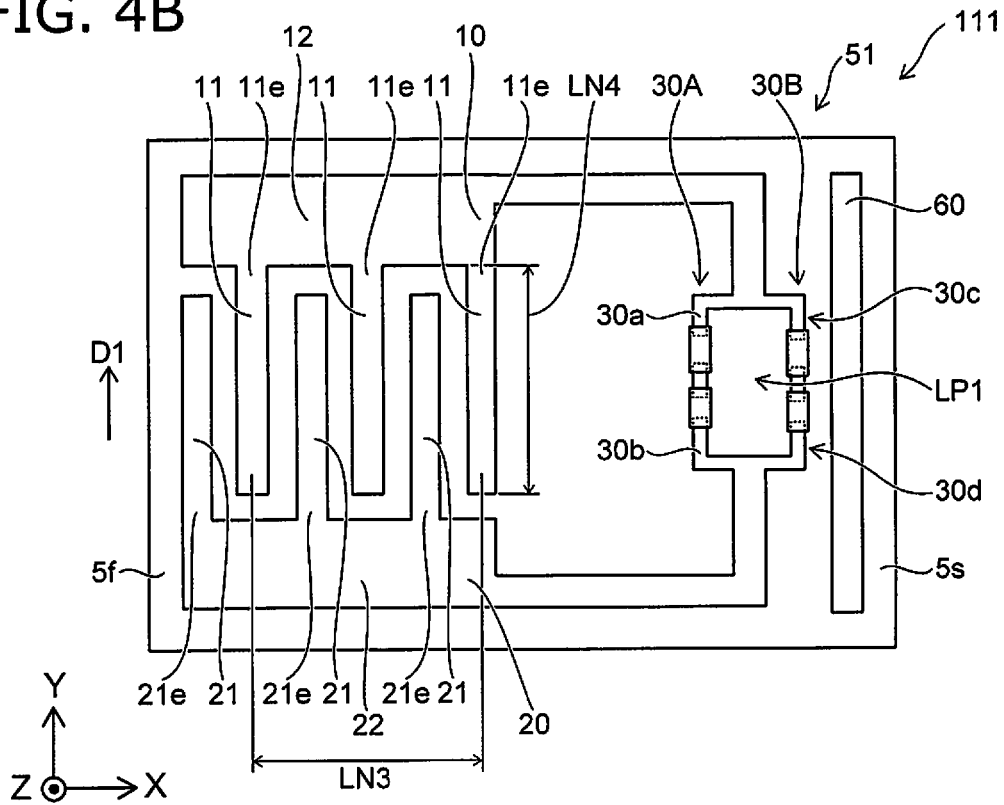

FIG. 4A and FIG. 4B are schematic views illustrating the oscillator and the electronic circuit according to the first embodiment.

Figure 5:
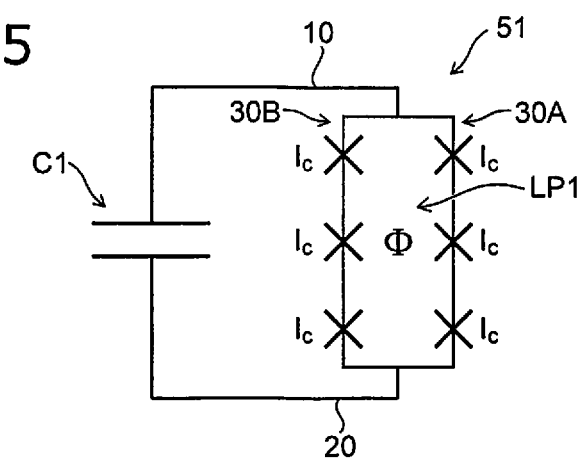
FIG. 5 is a schematic view illustrating the electronic circuit according to the first embodiment.

FIG. 5 is a schematic view illustrating the electronic circuit according to the first embodiment.

FIG. 5 is an equivalent circuit.

As shown in FIGS. 4A and 4B, an oscillator 111 according to the first embodiment includes an electronic circuit 51 and the magnetic field application portion 60. The electronic circuit 51 according to the embodiment includes the first conductive component 10, the second conductive component 20, the first current path 30A, and the second current path 30B.

In the example, the first conductive component 10 and the second conductive component 20 have an interdigital structure.

In such a case as well, for example, the substrate 5s that has the first surface 5f is further provided. The first conductive component 10 and the second conductive component 20 are provided at the first surface 5f. The first conductive component 10 includes a first connection portion 12 and multiple first extension portions 11. The multiple first extension portions 11 are aligned in the first direction D1 along the first surface 5f. The first connection portion 12 connects end portions (first end portions 11e) of the multiple first extension portions 11. In the example, the first direction D1 is the Y-axis direction.

For example, the second conductive component 20 includes a second connection portion 22 and multiple second extension portions 21. The multiple second extension portions 21 are aligned in the first direction D1. The second connection portion 22 connects end portions (second end portions 21e) of the multiple second extension portions 21. Thus, the second conductive component 20 includes the second extension portion 21 aligned in the first direction D1 between two of the multiple first extension portions 11.

In the electronic circuit 51 and the oscillator 111 as well, it is unnecessary to markedly increase the capacitance to obtain the target resonant frequency. For example, a moderately small nonlinearity is obtained. An oscillator that has good characteristics is obtained.

The first conductive component 10 and the second conductive component 20 are mutually-interchangeable in the example.

In the example as well, the first conductive component 10 is set to be small (e.g., short). Thereby, the first conductive component 10 can be considered to be the lumped constant circuit-type.

For example, the length of the first conductive component 10 as a circuit corresponds to the sum of a distance LN3 between the two most distal first extension portions 11 of the multiple first extension portions 11 (referring to FIG. 4B) and 2 times a length LN4 in the first direction D1 of the multiple first extension portions 11 (referring to FIG. 4B). This length is, for example, not more than ⅛ of the wavelength corresponding to the oscillation frequency. For example, this length corresponds to the length of the first conductive component 10 as an electrical circuit.

Second Embodiment

A calculating device according to a second embodiment includes multiple oscillators according to the first embodiment. Cases will now be described where the multiple oscillators according to the first embodiment are the oscillators 110.

Figure 6:
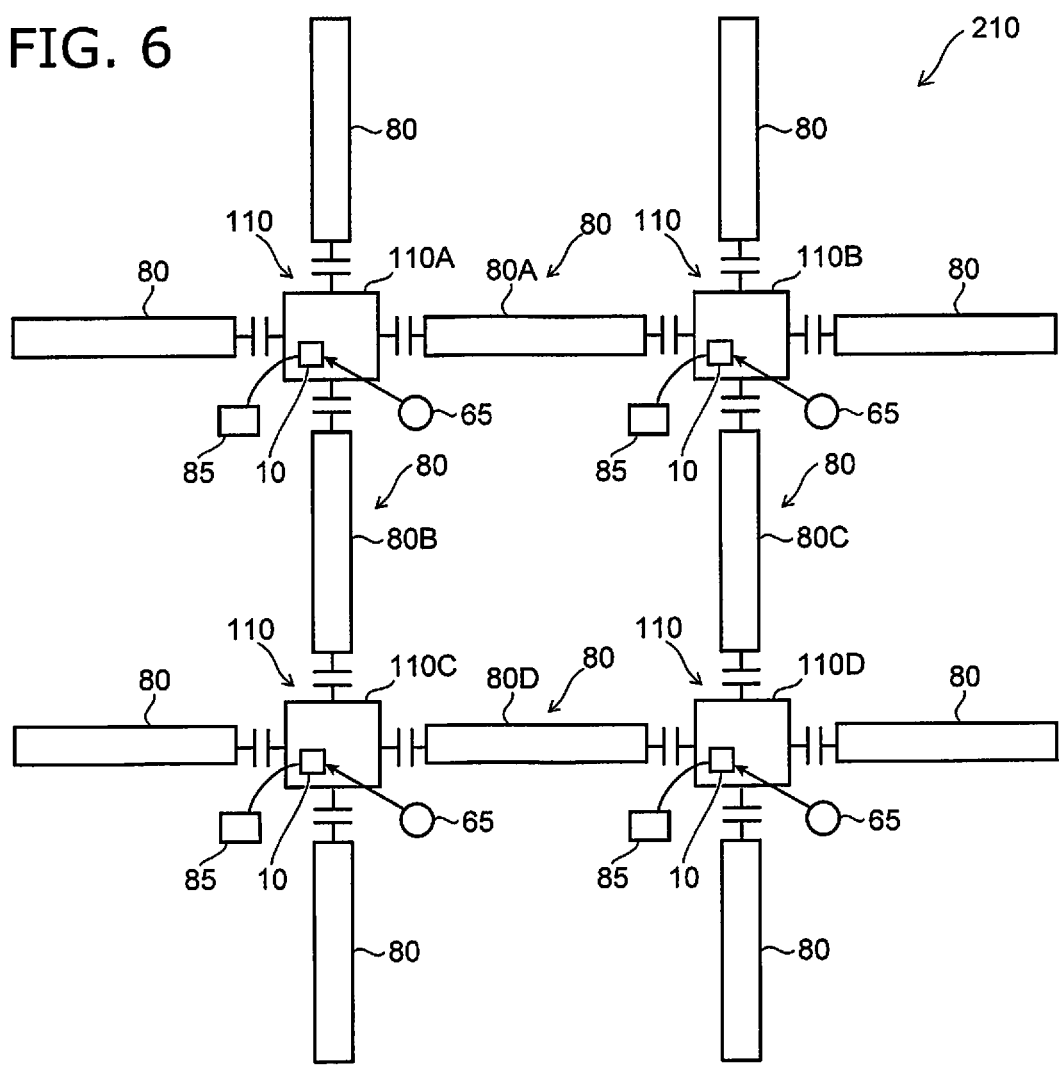
FIG. 6 is a schematic view illustrating the calculating device according to the second embodiment.

FIG. 6 is a schematic view illustrating the calculating device according to the second embodiment.

As shown in FIG. 6, the calculating device 210 according to the second embodiment includes the multiple oscillators 110 and a tunable coupler 80. The tunable coupler 80 couples one of the multiple oscillators 110 and another one of the multiple oscillators 110 to each other.

For example, the multiple oscillators 110 include first to fourth oscillators 110A to 110D. Multiple tunable couplers 80 are provided in the example. For example, the multiple tunable couplers 80 include first to fourth tunable couplers 80A to 80D.

The first tunable coupler 80A couples the first oscillator 110A and the second oscillator 110B to each other. The second tunable coupler 80B couples the first oscillator 110A and the third oscillator 110C to each other. The third tunable coupler 80C couples the second oscillator 110B and the fourth oscillator 110D to each other. The fourth tunable coupler 80D couples the third oscillator 110C and the fourth oscillator 110D to each other.

The multiple oscillators 110 each include the electronic circuit 50 and the magnetic field application portion 60 (referring to FIG. 1A to FIG. 1C). The multiple oscillators 110 each may further include the controller 70. The multiple oscillators 110 may further include one controller 70. Each of the multiple oscillators 110 is connected to the reader 85. The reader 85 may be included in the controller 70.

The tunable couplers 80 can adjust the strength of the coupling of the multiple oscillators 110. The tunable coupler 80 includes, for example, a microwave waveguide resonator including a dc SQUID.

For example, an external field application portion 65 that can irradiate a microwave as an external field is capacitively coupled to the multiple oscillators 110.

For example, when solving a combinatorial optimization problem (an Ising problem) in the calculating device 210, the coupling strength and the external field strength are set according to the given problem. For example, the multiple oscillators 110 are caused to oscillate by increasing the pump power of the multiple oscillators 110 from zero. The problem can be solved thereby.

In the embodiment, for example, a quantum gate operation can be performed by controlling the coupling strength, the external field strength, and the pump strength. In the quantum gate operation, two stable oscillation states of each of the multiple oscillators 110 is used as the 0 state or the 1 state of the quantum bit.

Figure 7:
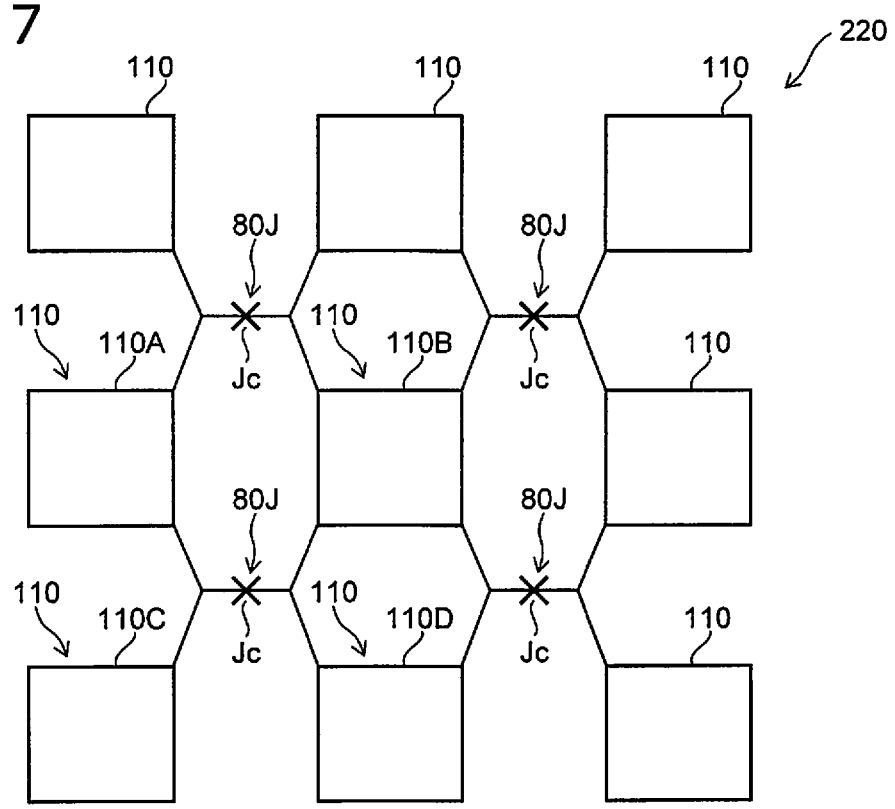
FIG. 7 is a schematic view illustrating a calculating device according to the second embodiment.

FIG. 7 is a schematic view illustrating a calculating device according to the second embodiment.

As shown in FIG. 7, the calculating device 220 according to the second embodiment includes the multiple oscillators 110 and a coupler 80J. The coupler 80J includes a Josephson junction JC (a Josephson junction). The coupler 80J is a nonlinear coupler. For example, the multiple oscillators 110 each include the electronic circuit 50 and the magnetic field application portion 60. The multiple oscillators 110 each may further include the controller 70. The electronic circuit 50, the magnetic field application portion 60, and the controller 70 are not illustrated in FIG. 7.

For example, the multiple oscillators 110 include the first to fourth oscillators 110A to 110D. The coupler 80J couples at least the first to fourth oscillators 110A to 110D to each other.

For example, the multiple oscillators 110 are arranged in a planar configuration. Four mutually-adjacent oscillators 110 are coupled by the nonlinear coupler 80J including the Josephson junction. For example, the oscillation frequency of each of the four coupled oscillators 110 is set appropriately. In one example, the sum of the oscillation frequencies of two oscillators 110 is substantially equal to the sum of the oscillation frequencies of another two oscillators 110. For example, the sum of the oscillation frequencies of the two oscillators 110 is smaller than the nonlinearity (the Kerr coefficient) of each of the two oscillators 110.

Figure 8:
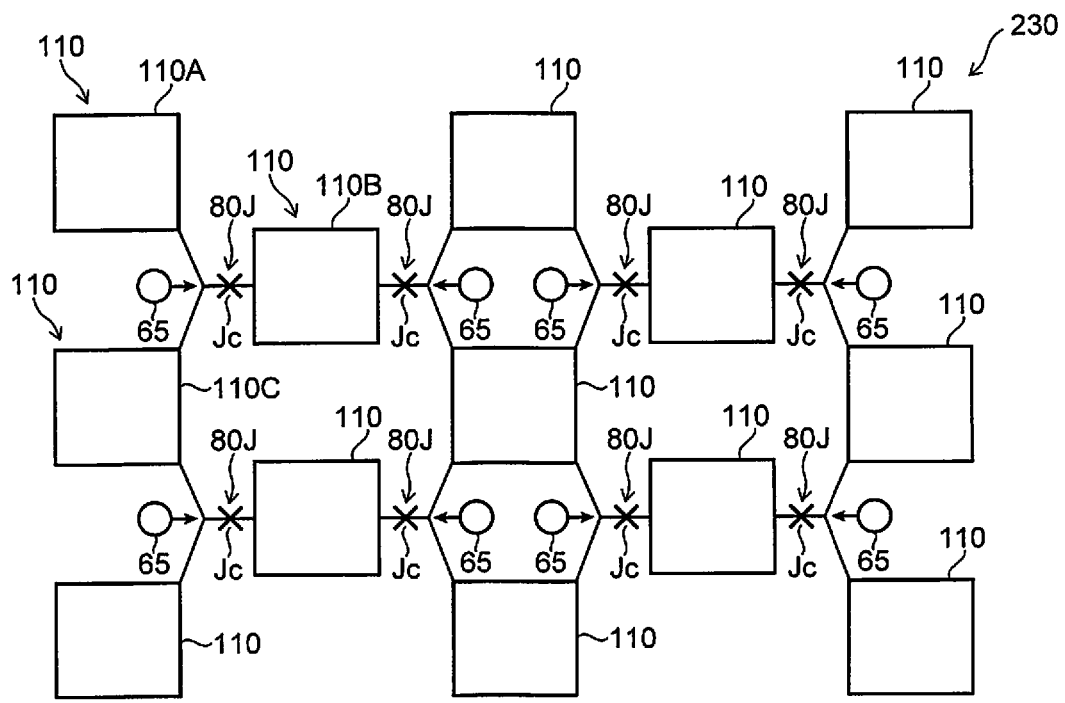
FIG. 8 is a schematic view illustrating a calculating device according to the second embodiment.

FIG. 8 is a schematic view illustrating a calculating device according to the second embodiment.

As shown in FIG. 8, the calculating device 230 according to the second embodiment includes the multiple oscillators 110, the coupler 80J, and the external field application portion 65. The coupler 80J includes the Josephson junction JC (the Josephson junction). The coupler 80J is a nonlinear coupler. For example, the multiple oscillators 110 each include the electronic circuit 50 and the magnetic field application portion 60. The multiple oscillators 110 each may further include the controller 70. The electronic circuit 50, the magnetic field application portion 60, and the controller 70 are not illustrated in FIG. 8.

The multiple oscillators 110 include the first to third oscillators 110A to 110C. The coupler 80J couples at least the first to third oscillators 110A to 110C to each other. The external field application portion 65 irradiates a microwave on at least the coupler 80J recited above. The external field application portion 65 is, for example, an interconnect line, etc.

For example, three mutually-adjacent oscillators 110 are coupled by a nonlinear coupler including a Josephson junction. An external field is applied to the nonlinear coupler by the external field application portion 65. The frequency of the external field is set appropriately. For example, the frequency of the external field is set to the difference between the sum of the oscillation frequencies of two oscillators 110 included in the three coupled oscillators 110 and the oscillation frequency of the other oscillator 110 included in the three coupled oscillators 110. The strength of the coupling can be adjusted by the strength of the external field. In the embodiment, the difference between the frequency of the external field and the difference recited above is smaller than the nonlinearity (the Kerr coefficient) of each of the three oscillators 110.

The embodiments may include the following configurations (e.g., technological proposals).

Configuration 1

An electronic circuit, comprising:
a first conductive component;
a second conductive component capacitively coupled to the first conductive component;
a first current path including a superconductor, the first current path including a first portion and a second portion, the first portion being connected to the first conductive component, the second portion being connected to the second conductive component, the first current path including N first Josephson junctions (N being an integer of 2 or more) connected in series and provided between the first portion and the second portion; and
a second current path including a superconductor, the second current path including a third portion and a fourth portion, the third portion being connected to the first conductive component, the fourth portion being connected to the second conductive component, the second current path including a second Josephson junction connected in series and provided between the third portion and the fourth portion.

Configuration 2

The electronic circuit according to Configuration 1, wherein
a plurality of the second Josephson junctions is provided, and
a number of the second Josephson junctions is the same as N.

Configuration 3

The electronic circuit according to Configuration 1 or 2, wherein a critical current value of the first Josephson junction is not less than 0.7 times and not more than 1.3 times a critical current value of the second Josephson junction.

Configuration 4

The electronic circuit according to any one of Configurations 1 to 3, wherein the second current path is aligned with the first current path.

Configuration 5

The electronic circuit according to any one of Configurations 1 to 4, wherein a potential of the second conductive component is substantially fixed.

Configuration 6

An oscillator, comprising:
the electronic circuit according to any one of Configurations 1 to 5; and
a magnetic field application portion.

Configuration 7

The oscillator according to Configuration 6, wherein the magnetic field application portion applies a magnetic field to one space surrounded with the first conductive component, the second conductive component, the first current path, and the second current path.

Configuration 8

The oscillator according to Configuration 6 or 7, further comprising a controller supplying a current to the magnetic field application portion.

Configuration 9

The oscillator according to Configuration 8, wherein
the controller modulates the current, and
an oscillation frequency of the oscillator changes according to a modulation frequency of the current.

Configuration 10

The oscillator according to Configuration 9, wherein the oscillation frequency is 0.5 times the modulation frequency.

Configuration 11

The oscillator according to Configuration 9, further comprising a substrate having a first surface,
the first conductive component and the second conductive component being provided at the first surface,
the second conductive component being provided around the first conductive component along the first surface.

Configuration 12

The oscillator according to Configuration 11, wherein the second conductive component surrounds the first conductive component along the first surface.

Configuration 13

The oscillator according to Configuration 11 or 12, wherein a length of the first conductive component in a first direction along the first surface is not more than ⅛ of a wavelength corresponding to the oscillation frequency.

Configuration 14

The oscillator according to Configuration 9 or 10, further comprising a substrate having a first surface;
the first conductive component and the second conductive component being provided at the first surface,
the first conductive component including a first connection portion and a plurality of first extension portions, the plurality of first extension portions being aligned in a first direction along the first surface, the first connection portion connecting end portions of the plurality of first extension portions,
the second conductive component including a second extension portion aligned with the first direction between two of the plurality of first extension portions.

Configuration 15

The oscillator according to Configuration 14, wherein a sum of a distance between the two most distal first extension portions of the plurality of first extension portions and 2 times a length in the first direction of the plurality of first extension portions is not more than ⅛ of a wavelength corresponding to the oscillation frequency.

Configuration 16

A calculating device, comprising:
a plurality of the oscillators according to any one of Configurations 6 to 15; and
a tunable coupler,
the tunable coupler being configured to couple one of the plurality of oscillators and an other one of the plurality of oscillators to each other.

Configuration 17

A calculating device, comprising:
a plurality of the oscillators according to any one of Configurations 6 to 15; and
a plurality of tunable couplers,
the plurality of oscillators including first to fourth oscillators,
the plurality of tunable couplers including first to fourth tunable couplers,
the first tunable coupler configured to couple the first oscillator and the second oscillator to each other,
the second tunable coupler configured to couple the first oscillator and the third oscillator to each other,
the third tunable coupler configured to couple the second oscillator and the fourth oscillator to each other,
the fourth tunable coupler configured to couple the third oscillator and the fourth oscillator to each other.

Configuration 18

A calculating device, comprising:

a plurality of the oscillators according to any one of Configurations 6 to 15; and a coupler including a Josephson junction, the plurality of oscillators including first to fourth oscillators, the coupler configured to couple at least the first to fourth oscillators to each other.

Configuration 19

A calculating device, comprising:

a plurality of the oscillators according to any one of Configurations 6 to 15;

a coupler including a Josephson junction; and an external field application portion, the plurality of oscillators including first to third oscillators, the coupler being configured to couple at least the first to third oscillators to each other, the external field application portion being configured to irradiate a microwave on at least the coupler.

According to the embodiments, an electronic circuit, an oscillator, and a calculating device can be provided in which both nonlinearity and low loss can be realized.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic circuits or oscillators such as conductive components, current paths, Josephson junctions, magnetic field application portions, controllers, readers, etc., and included in calculating devices such as nanotube couplers, couplers, external field application portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic circuits, oscillators, and calculating devices practicable by an appropriate design modification by one skilled in the art based on the electronic circuits, the oscillators, and the calculating devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An oscillator comprising:

a magnetic field application portion;

a controller supplying a current to the magnetic field application portion; and an electronic circuit comprising:

a first conductive component;

a second conductive component capacitively coupled to the first conductive component;

a first current path including a superconductor, the first current path including a first portion and a second portion, the first portion being connected to the first conductive component, the second portion being connected to the second conductive component, the first current path including N first Josephson junctions (N being an integer of 2 or more) connected in series and provided between the first portion and the second portion; and a second current path including a superconductor, the second current path including a third portion and a fourth portion, the third portion being connected to the first conductive component, the fourth portion being connected to the second conductive component, the second current path including a second Josephson junction connected in series and provided between the third portion and the fourth portion.

2. The oscillator according to claim 1, wherein the controller modulates the current, and an oscillation frequency of the oscillator changes according to a modulation frequency of the current.

3. The oscillator according to claim 2, wherein the oscillation frequency is 0.5 times the modulation frequency.

4. The oscillator according to claim 2, further comprising a substrate having a first surface, the first conductive component and the second conductive component being provided at the first surface, the second conductive component being provided around the first conductive component along the first surface.

5. The oscillator according to claim 4, wherein the second conductive component surrounds the first conductive component along the first surface.

6. The oscillator according to claim 4, wherein a length of the first conductive component in a first direction along the first surface is not more than $\frac{1}{8}$ of a wavelength corresponding to the oscillation frequency.

7. The oscillator according to claim 2, further comprising a substrate having a first surface, the first conductive component and the second conductive component being provided at the first surface, the first conductive component including a first connection portion and a plurality of first extension portions, the plurality of first extension portions being aligned in a first direction along the first surface, the first connection portion connecting end portions of the plurality of first extension portions, the second conductive component including a second extension portion aligned in the first direction between two of the plurality of first extension portions.

8. The oscillator according to claim 7, wherein a sum of a distance between the two most distal first extension portions of the plurality of first extension portions and 2 times a length in the first direction of the plurality of first extension portions is not more than $\frac{1}{8}$ of a wavelength corresponding to the oscillation frequency.

9. A calculating device, comprising:

a plurality of the oscillators, the plurality of oscillators each comprising:

a magnetic field application portion; and an electronic circuit comprising:

a first conductive component;

a second conductive component capacitively coupled to the first conductive component;

a first current path including a superconductor, the first current path including a first portion and a second portion, the first portion being connected to the first conductive component, the second portion being connected to the second conductive component, the first current path including N first Josephson junctions (N being an integer of 2 or more) connected in series and provided between the first portion and the second portion; and a second current path including a superconductor, the second current path including a third portion and a fourth portion, the third portion being connected to the first conductive component, the fourth portion being connected to the second conductive component, the second current path including a second Josephson junction connected in series and provided between the third portion and the fourth portion; and a tunable coupler, the tunable coupler configured to couple one of the plurality of oscillators and another one of the plurality of oscillators to each other.

10. A calculating device, comprising:

a plurality of the oscillators, the plurality of oscillators each comprising:
  a magnetic field application portion; and
  an electronic circuit comprising:
    a first conductive component;
    a second conductive component capacitively coupled to the first conductive component;
    a first current path including a superconductor, the first current path including a first portion and a second portion, the first portion being connected to the first conductive component, the second portion being connected to the second conductive component, the first current path including N first Josephson junctions (N being an integer of 2 or more) connected in series and provided between the first portion and the second portion; and
    a second current path including a superconductor, the second current path including a third portion and a fourth portion, the third portion being connected to the first conductive component, the fourth portion being connected to the second conductive component, the second current path including a second Josephson junction connected in series and provided between the third portion and the fourth portion; and a plurality of tunable couplers, the plurality of oscillators including first to fourth oscillators, the plurality of tunable couplers including first to fourth tunable couplers, the first tunable coupler being configured to couple the first oscillator and the second oscillator to each other, the second tunable coupler is configured to couple the first oscillator and the third oscillator to each other, the third tunable coupler being configured to couple the second oscillator and the fourth oscillator to each other, the fourth tunable coupler being configured to couple the third oscillator and the fourth oscillator to each other.

11. A calculating device, comprising:

a plurality of the oscillators, the plurality of oscillators each comprising:
  a magnetic field application portion; and
  an electronic circuit comprising:
    a first conductive component;
    a second conductive component capacitively coupled to the first conductive component;
    a first current path including a superconductor, the first current path including a first portion and a second portion, the first portion being connected to the first conductive component, the second portion being connected to the second conductive component, the first current path including N first Josephson junctions (N being an integer of 2 or more) connected in series and provided between the first portion and the second portion; and
    a second current path including a superconductor, the second current path including a third portion and a fourth portion, the third portion being connected to the first conductive component, the fourth portion being connected to the second conductive component, the second current path including a second Josephson junction connected in series and provided between the third portion and the fourth portion; and a coupler including a Josephson junction, the plurality of oscillators including first to fourth oscillators, the coupler being configured to couple at least the first to fourth oscillators to each other.

12. A calculating device, comprising:

a plurality of the oscillators, the plurality of oscillators each comprising:
  a magnetic field application portion; and
  an electronic circuit comprising:
    a first conductive component;
    a second conductive component capacitively coupled to the first conductive component;
    a first current path including a superconductor, the first current path including a first portion and a second portion, the first portion being connected to the first conductive component, the second portion being connected to the second conductive component, the first current path including N first Josephson junctions (N being an integer of 2 or more) connected in series and provided between the first portion and the second portion; and
    a second current path including a superconductor, the second current path including a third portion and a fourth portion, the third portion being connected to the first conductive component, the fourth portion being connected to the second conductive component, the second current path including a second Josephson junction connected in series and provided between the third portion and the fourth portion;

a coupler including a Josephson junction; and an external field application portion, the plurality of oscillators including first to third oscillators, the coupler configured to couple at least the first to third oscillators to each other, the external field application portion being configured to irradiate a microwave on at least the coupler.

* * * * *